(12) United States Patent
Blumenthal

(10) Patent No.: US 10,805,453 B1
(45) Date of Patent: Oct. 13, 2020

(54) DEVICE MUTE CONTROL

(71) Applicant: Tico Blumenthal, Sunnyvale, CA (US)

(72) Inventor: Tico Blumenthal, Sunnyvale, CA (US)

( * ) Notice: Subject to any disclaimer, the term of this patent is extended or adjusted under 35 U.S.C. 154(b) by 0 days.

(21) Appl. No.: 16/551,254

(22) Filed: Aug. 26, 2019

(51) Int. Cl.
*H04M 1/725* (2006.01)
*G06F 3/16* (2006.01)
*H03G 3/32* (2006.01)

(52) U.S. Cl.
CPC ........ *H04M 1/72577* (2013.01); *G06F 3/165* (2013.01); *H03G 3/32* (2013.01)

(58) Field of Classification Search
CPC combination set(s) only.
See application file for complete search history.

(56) References Cited

U.S. PATENT DOCUMENTS

| | | | |
|---|---|---|---|
| 6,778,380 B2 | 8/2004 | Murray | |
| 2010/0207881 A1* | 8/2010 | Miller | G06F 3/014 345/158 |
| 2011/0218810 A1* | 9/2011 | Ramstrum | G10L 13/06 704/268 |
| 2011/0319128 A1* | 12/2011 | Miwa | H04W 4/80 455/550.1 |
| 2014/0139637 A1* | 5/2014 | Mistry | G06F 1/163 348/46 |
| 2015/0277559 A1* | 10/2015 | Vescovi | G06F 3/0416 345/173 |
| 2015/0373443 A1* | 12/2015 | Carroll | H04M 1/0281 381/364 |
| 2016/0306421 A1 | 10/2016 | Piccinini | |
| 2018/0064356 A1* | 3/2018 | Mendenhall | G16H 40/67 |

* cited by examiner

*Primary Examiner* — Ganiyu A Hanidu
(74) *Attorney, Agent, or Firm* — Hahn & Associates PLLC; Roger Hahn

(57) ABSTRACT

The invention relates to devices, systems, and methods for controlling the audio input state of a device. The devices, systems, and methods include a band having an activator in communication with a device that mutes the device, the activator serving as a reversible temporary toggle to the input state of an incoming audio stream, unmuting the device when desired.

22 Claims, 5 Drawing Sheets

DEVICE MUTE CONTROL

FIELD

The disclosure relates to devices, systems, and methods for controlling the audio input state of a device. The devices, systems, and methods include a band having an activator in communication with a device that mutes the device, the activator serving as a reversible temporary toggle to the input state of an incoming audio stream, unmuting the device when desired.

BACKGROUND

Audio quality in digital communications have been improved through the use of noise cancelling technology. However, devices, such as phones, that receive and transmit sound fail when picking up on background noise, reducing usability in noisy environments and degrading the user experience in group teleconferences, digital assistant communications and the like. Some devices are equipped with mute buttons, allowing the incoming audio to be shut off, preventing the transmission of background noises. However, these devices require active manipulation, often requiring focused effort and device/software manipulation to mute or unmute the device. This active manipulation is both error-prone, wherein an audio stream can unintentionally become active, and is incompatible with users actively navigating through their physical environment, including walking through an airport, driving, bicycling or any other form of multi-tasking in an office or remote location.

Hence, there is a need for enabling quick, reliable, and verifiable muting and unmuting of incoming audio stream to a device, ensuring that background noise and unintended conversation is not transmitted. There is a need for systems and methods that mute the incoming audio, but that can be unmuted easily without active navigation of an interface.

SUMMARY OF THE INVENTION

The first aspect of the invention relates to a band. In any embodiment, the band can include and activator and a transmitter; wherein the band is configured to communicate wirelessly via the transmitter with a device having an incoming audio stream selected from any of a microphone, a digital audio source, or an analog audio source; wherein the band mutes the incoming audio stream on the device when the activator is in an inactive state and unmutes the incoming audio stream when the activator is in an active state.

In any embodiment, the band can be covered by any one of a membrane, coating, and combinations thereof.

In any embodiment, the band can include an inductive coil as a power source.

In any embodiment, the transmitter can be a printed antenna.

In any embodiment, the device can be a phone.

In any embodiment, the transmitter can be a Bluetooth transmitter, an RFID transmitter, or a near field communication transmitter.

In any embodiment, the transmitter can be a near field communication transmitter, and the activator, in an active state, can interrupt communication from the transmitter.

In any embodiment, the activator is a button having one or more tactile domes.

In any embodiment, the one or more tactile domes can have a shape selected from any one of a circle, triangle, oblong, and rectangle.

In any embodiment, the activator can be a button positioned on an outer surface of the band.

In any embodiment, the band can include an indicator indicating an audio state of the device.

In any embodiment, the indicator can be positioned on the band.

In any embodiment, the indicator can be an LED.

In any embodiment, the transmitter can communicate with an application installed on the device.

In any embodiment, the transmitter can communicate with an operating system of the device.

In any embodiment, the activator can be a button; and the band further can include a locking mechanism, the locking mechanism engageable to maintain the activator in either the active or inactive state.

The features disclosed as being part of the first aspect of the invention can be in the first aspect of the invention, either alone or in combination, or follow any arrangement or permutation of any one or more of the described elements.

The second aspect of the invention is drawn to a system. In any embodiment, the system can include the band of the first aspect of the invention and a phone; wherein the phone is programmed to communicate with the band; and wherein the phone is programmed to mute an incoming audio stream when the activator on the band is in an inactive state and to unmute the incoming audio stream when the activator on the band is in an active state.

In any embodiment, the phone can be programmed to communicate with the band via an external module in contact with the phone.

In any embodiment, the transmitter can communicate with an application installed on the phone.

In any embodiment, the transmitter can communicate with an operating system of the phone.

In any embodiment, the phone can be programmed to continuously receive a state of the activator on the band.

In any embodiment, the phone can be programmed to communicate with the band when the band is in contact with the phone.

The features disclosed as being part of the second aspect of the invention can be in the second aspect of the invention, either alone or in combination, or follow any arrangement or permutation of any one or more of the described elements.

DETAILED DESCRIPTION

Figure 1:
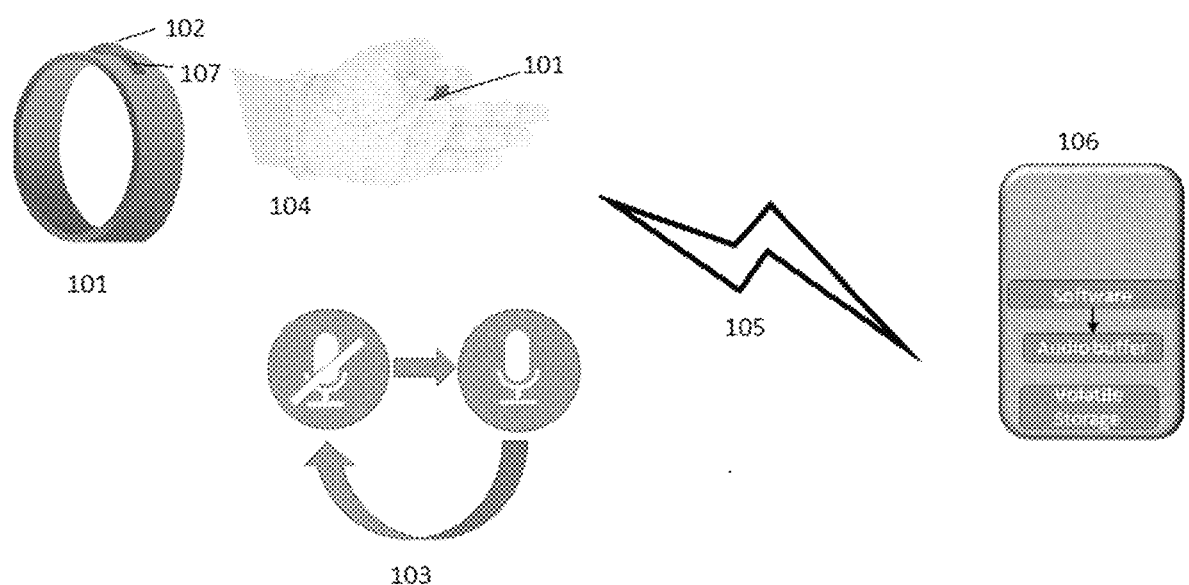
FIG. 1 is an overview of a system for controlling an audio state of a device.

Unless defined otherwise, all technical and scientific terms used have the same meaning as commonly understood by one of ordinary skill in the art.

The articles "a" and "an" are used to refer to one to over one (i.e., to at least one) of the grammatical object of the article. For example, "an element" means one element or over one element.

The term "activator" refers to a component that controls another component depending on whether the activator is in an active or inactive state.

An "active state" is a state of a component that causes the component to perform or refrain from performing an action. The action, or refraining from the action is the opposite of what the component does in an "inactive state."

An "analog audio source" is an audio source that uses vibrations to create sound.

The term "antenna" can be any component capable of sending or receiving electromagnetic waves or signals.

The term "application" refers to software installed on a device.

The term "audio state" refers to whether or not an incoming audio stream is muted.

The term "band" refers to any component capable of holding other components in place.

A "Bluetooth transmitter" is a transmitter that uses short wave UHF radio waves to transmit signals.

A "button" is a depressible component that causes an action when either depressed or non-depressed.

A "circle" is a two-dimensional shape having no corners and a generally constant diameter.

A "coating" is a thin layer of a material.

The terms "communication" or to "communicate" refers to transmission and/or receipt of information or signals between devices.

The term "comprising" includes, but is not limited to, whatever follows the word "comprising." Use of the term indicates the listed elements are required or mandatory but that other elements are optional and may be present.

The term "configured to communicate" refers to a device capable of sending and/or receiving signals to and/or from a separate device.

The term "consisting of" includes and is limited to whatever follows the phrase "consisting of." The phrase indicates the limited elements are required or mandatory and that no other elements may be present.

The term "consisting essentially of" includes whatever follows the term "consisting essentially of" and additional elements, structures, acts or features that do not affect the basic operation of the apparatus, structure or method described.

The term "contact" refers to direct touching of two components or devices.

The term "continuously" refers a process occurring without significant interruption.

To "cover" or "covered" refers to laying a coating or component on top of a second component.

The term "device" refers to any component or system of components capable of performing a function.

A "digital audio source" is a source of sound that uses a digital representation of the vibrations or sound waves that can be recreated to generate sound.

The terms "electrical communication," "electrically communicate," "electrically communicating," and the like can refer to the ability to transmit electronic data, instructions, information wirelessly, via direct electrical connection, or any other electrical transmission means between one or more components.

"Engageable" or to "engage" refers to the ability of components to interact structurally.

An "external module" is any component connected to a device that is configured to interact with the device.

The term "incoming audio stream" refers to any source of sound that can be received by a device.

An "indicator" is any component or set of components that provides a state of a device or system.

An "inductive coil" is a power source that produces voltages from a magnetic field.

The term "installed" refers to software saved in a memory of a device.

The term "interior" refers to a portion of a component that is generally inside of the component and not exposed to the outside.

To "interrupt" means to stop a component or system from performing an action.

An "LED," or light emitting diode, is a component that emits light when electrical current is passed through the LED.

A "locking mechanism" is a component or set of components that can maintain a state of a device or position of other components.

A "membrane" is a thin material that can cover or coat a component.

A "microphone" is a component that receives sound from an external source and transmits the sound to a system or amplifier.

The terms to "mute" or "muting" refer to a process of preventing the transmission of sound to or from a device.

A "near field communication transmitter" is a transmitter that communicates using magnetic field induction.

An "oblong" is a two-dimensional shape having no corners and an elongated shape.

The term "operating system" refers to software that supports the basic functions of a device.

The term "outer surface" refers to a surface of a component on the exterior of the component.

The term "periphery" refers to an edge of a component.

A "phone" is a device capable of communicating with and transmitting sound to other phones, computers, or devices.

The term "positioned" refers to the location of a component.

A "printed antenna" is a transmitter formed by etching the antenna into a metal component.

The term "programmed," when referring to a processor, can mean a series of instructions that cause a processor to perform certain steps.

The terms "received," "to receive," "receiving," and the like, means obtaining an electrical signal of any type.

A "rectangle" is a two-dimensional shape having four sides connected by generally right angles.

An "RFID transmitter" is a transmitter that communicates using radio frequency waves.

A "tactile dome" is a component that covers a button and collapses when depressed, causing movement of the button.

A "transmitter" is any component or device capable of sending electromagnetic waves or signals.

A "triangle" is a two-dimensional shape having three sides and three corners.

To "vent" refers to the movement of air into or out of a component or system.

A "vent channel" is any passageway through which air can enter or exit a system or component.

The term "via" refers to a method of carrying out a process. For example, communicating "via the transmitter" refers to sending signals using the transmitter.

The term "wirelessly" refers to the ability to transfer information without the need for a direct connection via cables or wires.

Device Mute Control

FIG. 1 illustrates a non-limiting embodiment of a system for controlling a mute function of a device. A band 101, can include an activator, shown as button 102 positioned on an outer surface of the band 101. The band 101 can be configured to communicate wirelessly, represented by communication 105, with a device having an incoming audio stream, illustrated as phone 106. The band 101 can include a transmitter (not shown), such as a Bluetooth transmitter, an RFID transmitter, or a near field communication transmitter. When in an inactive state, the activator can communicate to the device to mute an incoming audio stream. When the activator is activated, the activator can interrupt the communication between the transmitter and the device. In certain embodiments, the transmitter can be a printed antenna, which can communicate with a receiver on the phone 106. When the activator is in an inactive state, the band 101 mutes the phone 106 as illustrated by audio state 103. For example, the band 101 can cause a microphone on the phone 106 to be muted. Any incoming audio stream for the device, including a digital audio source or an analog audio source can be muted by the band 101.

To activate the activator, a user 104 can depress the button 102. When activated, the band 101 unmutes the incoming audio stream of the device, such as by unmuting a microphone on the phone 106. When the button 102 is released, placing the activator in an inactive state, the incoming audio stream is again muted.

In certain embodiments, the band 101 can include a locking mechanism engageable to maintain the activator in either the active or inactive state, illustrated as slot 107 in FIG. 1. When the user 104 slides the button 102 through slot 107, the button 102 can be locked in a depressed, or active state. Sliding the button 102 through the slot 107 in the opposite direction releases the locking mechanism, placing the activator in an inactive state unless activated by the user 104.

Although illustrated as button 102 in FIG. 1, one of skill in the art will understand that other activators could be used. Switches, touch sensors, or other methods of activation can be used in place of button 102. The band 101 in FIG. 1 is a ring. However, any band that includes an activator can be used, including elastic bands designed to fit in the palm of the hand or any other type of band. The device can be any device having an incoming audio stream, including phones, computers, or any other device where muting the incoming audio stream may be desired.

In FIG. 1, the band 101 is illustrated as a ring. One of skill in the art will understand that the band 101 can take any form or shape, and need not be a ring. In certain embodiments, the band 101 can fit around the user's finger, wrist, arm, or any other part. Alternatively, the band 101 need not be worn by the user 104, and can include any structure holding the active components of the system together. The band 101 can be any shape, and need not be circular.

Figure 2:
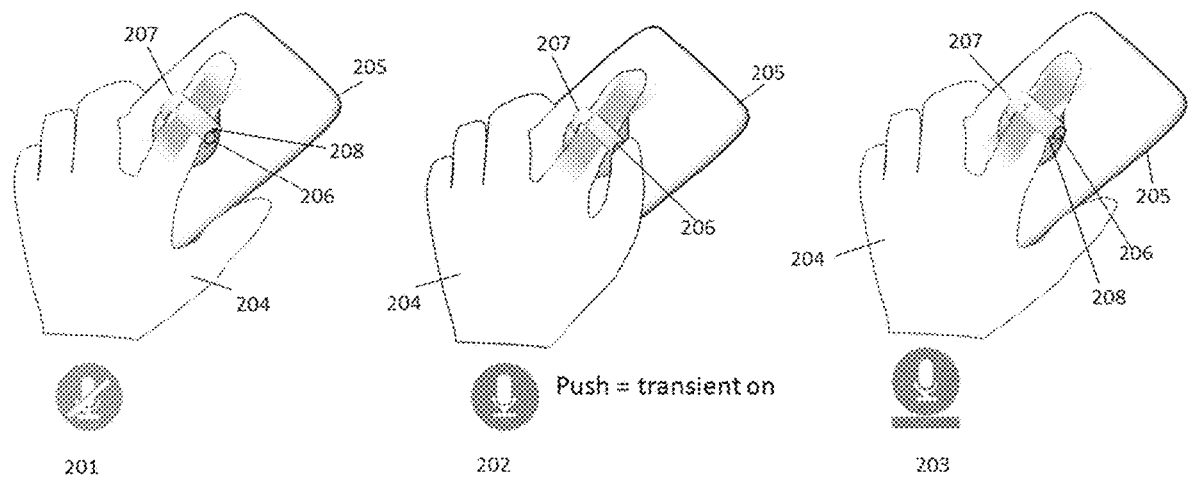
FIG. 2 illustrates use of the system for controlling an audio state of a device.

FIG. 2 illustrates use of the system. In 201, the band 207 is in communication with a device 205. The activator, button 206 is in an inactive state, muting the device 205. In 202, the user 204 has depressed button 206, activating the activator and unmuting the device 205. In 203, the user 204 has slid the button 206 through slot 208, locking the button 206 in an active state. As such, in 203, the device 205 is locked in a non-mute state, allowing communication without depressing the button 206.

Figure 3:
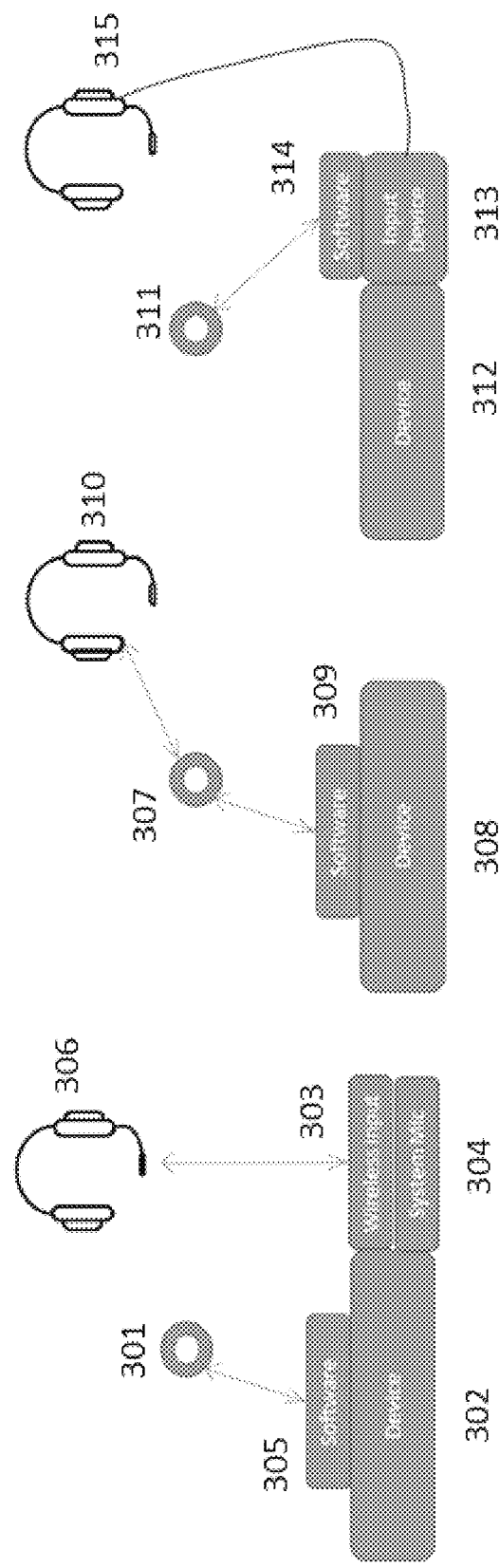
FIGS. 3A-C illustrate non-limiting implementations of the system.

FIGS. 3A-C illustrate non-limiting implementations of the system. In FIG. 3A, the band 301 communicates with a device 302 using software 305. The software 305 mutes a microphone 304 of the device 302. The band 301 mutes the microphone 304 at the software 305 level or OS level of the device 302. In certain embodiments, a wireless input system 303 in communication with a microphone or headset 306 is also muted by the band 301.

In FIG. 3B, the band 307 is in communication with a device 308 using software 309 and a wireless input, shown as headset 310. The software 309 can mute the microphone of the headset 310 via a daisy chain connection through the band 307. In certain embodiments, the band 307 can control the audio state of the device through the headset 310 microphone mute functionality. The band 307 can communicate the audio state to the device 308. Alternatively, the audio stream can be routed through the band 307 and the band 307 can be a repeater for the incoming audio stream. However, routing the audio stream through band 307 may not be possible with all transmitter types. Further, routing the audio stream through the band 307 would increase current drain for active-repeater, and can potentially introduce delays.

In FIG. 3C, the band 311 mutes the incoming audio stream via an external module 313. The band 311 communicates with the device 312 through software 314. The software 314, when the activator is in an inactive state, mutes the incoming audio stream from headset 315.

One of skill in the art will understand that other implementations are possible using various combinations of devices and audio streams beyond that shown in FIGS. 3A-C. The band can communicate with the device to mute the incoming audio stream whether the incoming audio stream is from a system microphone or a separate device. The band can communicate with the device through either the operating system of the device, or through an application or software installed on the device.

Figure 4:
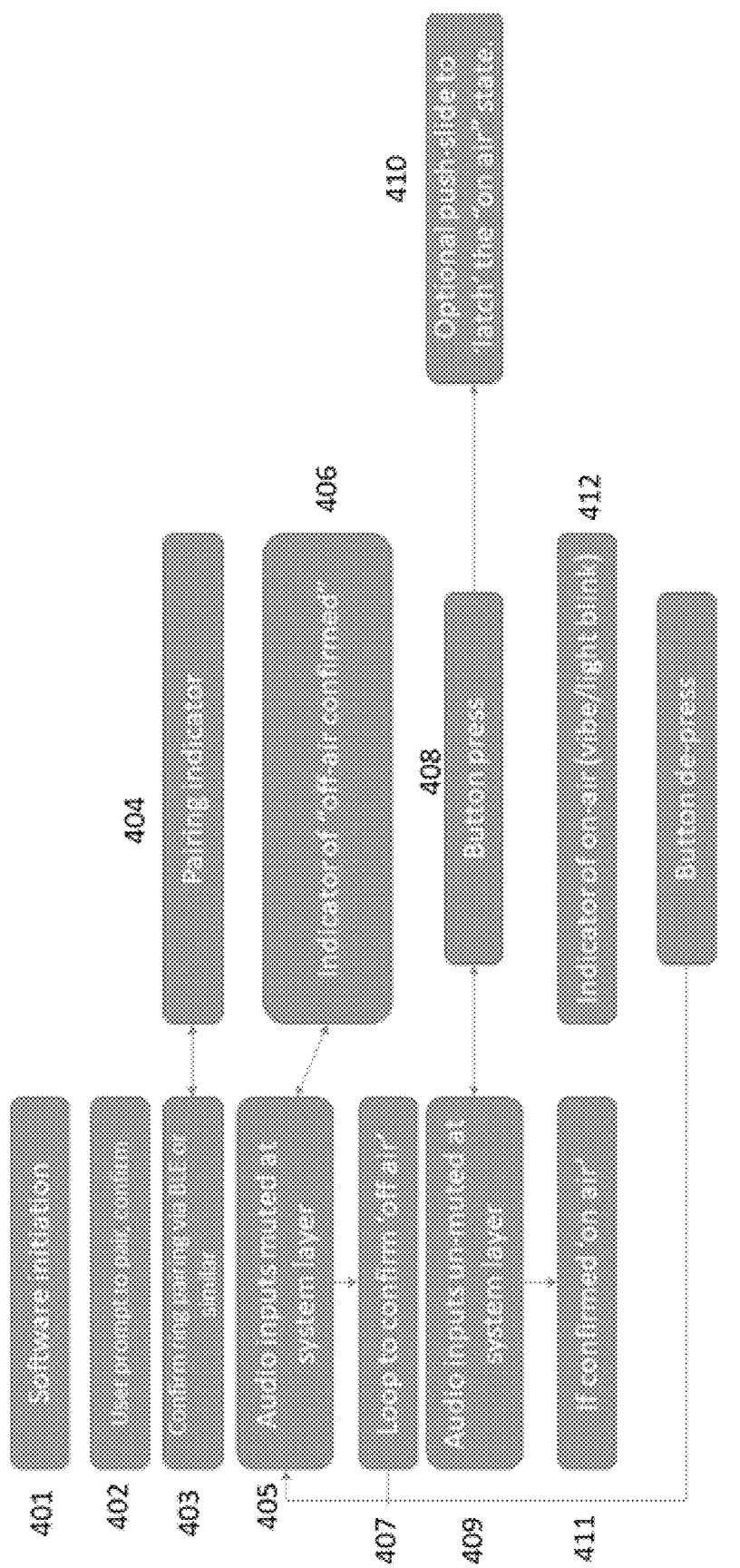
FIG. 4 is a flow chart illustrating the mechanism of the system.

FIG. 4 is a flow chart showing a non-limiting example of how the system works. In step 401, the software on a device is initiated. The software can program the device to communicate with the band. When within range of the band, the user can be prompted to pair the device and band in step 402. Alternatively, the device can be programmed to communicate with the band when the band is in contact with the device. As described, the pairing between the device and band can be accomplished with Bluetooth, Bluetooth Low Energy (BLE), RFID, or any other type of communication. In step 403, the device and/or band can confirm the pairing. In certain embodiments, an indicator placed on the device or band can confirm pairing in step 404.

When the device receives an incoming audio stream, whether from a microphone, a digital audio source, or an analog audio source, the system can mute the incoming audio stream in step 405. The indicator can confirm to the user that the incoming audio stream has been muted, or is "off-air" in step 406. In step 407, the device can perform a loop to confirm that the activator on the band is still in the inactive state, and the "off-air" state of the device can continue. The device can be programmed to continuously check and receive the state of the activator.

In step 408, the user can activate the activator, such as by pressing a button. The device can then un-mute the incoming audio stream at step 409. Optionally, the user can lock the activator into an active state with a locking mechanism, such as by sliding a button through a slot, in step 410. In step 411, the device can perform a loop to confirm that the activator on the band is still in the active state, and the "on-air," or unmuted, state of the device can continue. An indicator on the device or band can inform the user that the device is in an on-air state in step 412. In step 413, the user can place the activator back into the inactive step by depressing the button, and the device can go back to step 405 to mute the incoming audio stream.

Figure 5:
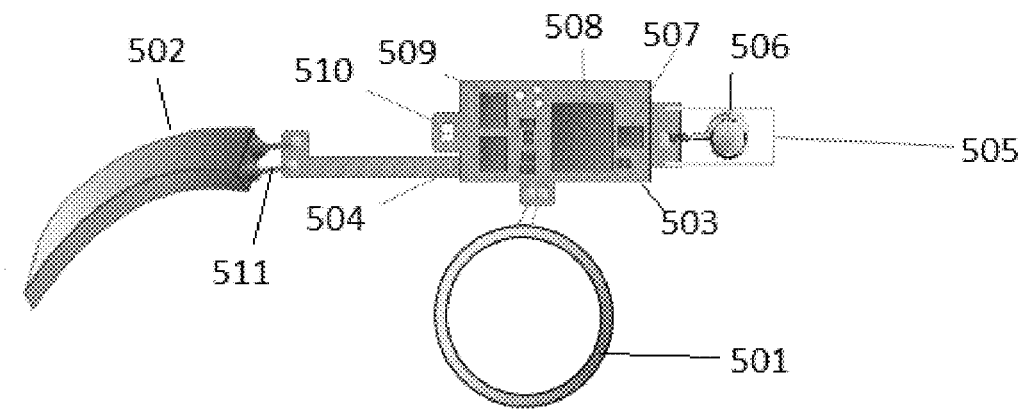
FIG. 5 is an exploded view of the active components of a band.

FIG. 5 illustrates an exploded view of the active components in a band 501. The active components can include a housing 503. A power source, such as battery 502 can plug into the housing 503 via prongs 511. In certain embodiments, the power source can be a battery 502 as illustrated in FIG. 5, such as a lithium polymer battery or any other type of battery small enough to fit in the band 501. However, any power source capable of providing the power needed to operate the active components can be used. An inductive coil can be used as the power source, eliminating the need for batteries. Power management component 504 can be included. The power management component 504 can be an integrated circuit controlling the flow and direction of electrical power. The power management component 504 can perform DC to DC conversion, power management during inductive battery charging, power source selection if multiple batteries are included, and diagnostics for battery status and monitoring, which could be important for voltage regulation, load balancing, etc. A microprocessor or CPU 508 can control the operation of the band 501. The band 501 can communicate with a device via the transmitter 507. As described, the transmitter 507 can be a printed antenna, a Bluetooth transmitter, an RFID transmitter, or any other component capable of communicating with the device. In certain embodiments, an additional near field communication transmitter 509 can be included. The additional near field communication transmitter 509 can be used as an identifier, website code and/or for holding other small amounts of data. For example, in certain embodiments, scanning the band 501 with a phone can automatically call up an installation link on a phone and provide a registration code or hash to the application to authenticate the device through near field communication transmitter 509. The activator, illustrated as button 505, can be used to control the audio state of the device. As described, the activator can include a locking mechanism, illustrated as slide frame 506. The slide frame 506 allows the button 505 to be moved through a slot (not shown) on the band 501, locking the button 505 in an active state, thereby locking the device into an unmuted or on-air state. Optionally, an LED 510 can be included in the band 501 as an indicator of the state of the device or activator. In other embodiments, an indicator can be included on the device rather than the band 501. Alternative indicators to the LED 510 can also be used, such as audio or tactile indicators of the state of the device or activator.

Figure 6:
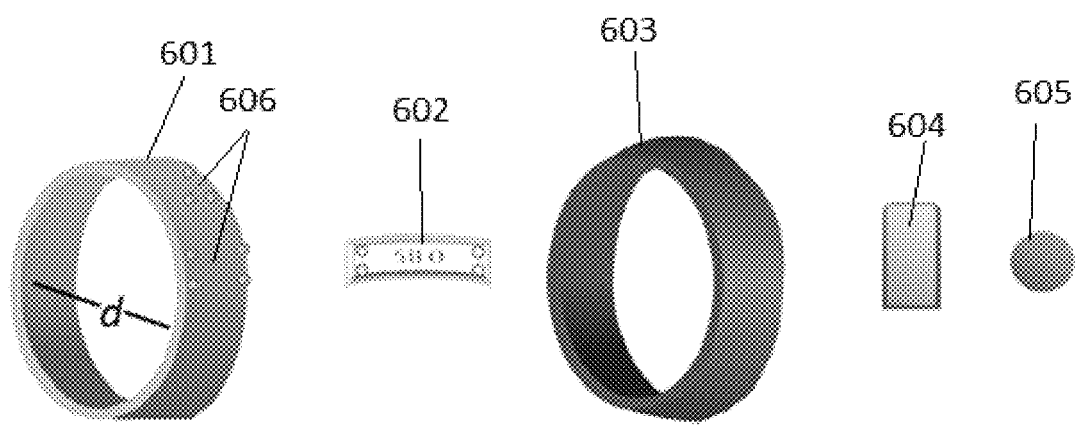
FIG. 6 is an exploded view of the inactive components of a band.

FIG. 6 illustrates the mechanical, or inactive, components of the system. An internal assembly 601 can include nodules 606 for connection to the active components described in FIG. 5. The internal assembly 601 can be covered with a membrane, coating, or a combination thereof to protect the active components and improve the comfort of the user. A silicone overmold 603 can serve as the coating or membrane. The silicone overmold 603 can also provide water proofing or water resistance to the band and internal components. One of skill in the art will understand that alternative components can be used in place of silicone overmold 603, including plastic, metal, or other materials. A tactile dome sleeve 604 can cover the activator, protecting the activator. A vent channel (not shown) positioned on a periphery of the interior of the tactile dome sleeve 604 can vent air in and out from under the tactile dome sleeve 604. The tactile dome sleeve 604 can have any shape, including a circle, a triangle, an oblong shape, or a rectangle. A silicone cover 605 can also be included. The user can press the silicone cover 605, which covers the button or other activator, to activate the activator. Optionally, an LED diffuser 602 can be included to allow the LED illustrated in FIG. 5 to serve as an indicator of the state of the activator or device.

Figure 7:
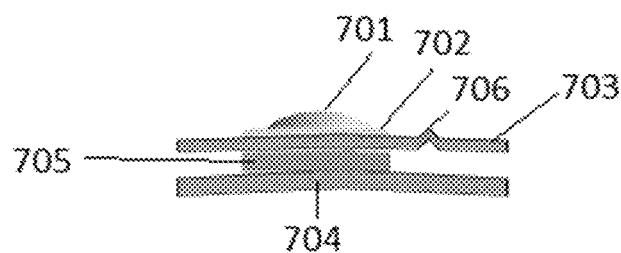
FIG. 7 is a close up of an activator.

FIG. 7 is a closeup of a button-type activator. The activator is in an active state when a circuit is formed between bottom plate 704, top plate 703, and a conductor 705. When the button 701 is depressed, the top plate 703 contacts conductor 705, closing the circuit with bottom plate 704. When the button 701 is released, the top plate 703 ceases to contact the conductor 705, the circuit is broken, and the activator is in an inactive state. A non-conductive material 702 can be included to help keep the top plate 703 from contacting the conductor 705 when the button 701 is not depressed. As described, a locking mechanism engageable to maintain the active state of the activator can be included to lock the activator into an active state. By sliding the button 701 to notch 706, the top plate 703 is forced downward, contacting conducting 705 and maintaining the activator in an active state without the need to hold the button 701. To unlock the locking mechanism, the button 701 can be slid back into the configuration shown in FIG. 7.

Figure 8:
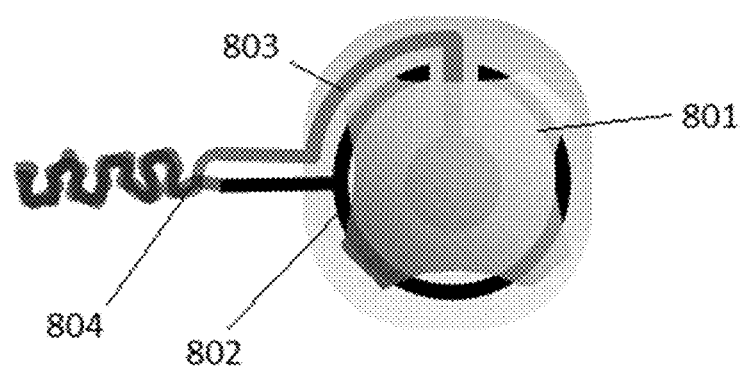
FIG. 8 is a close up view of a button used as an activator.

FIG. 8 illustrates the button shown in FIG. 7. The button can include a silicone cover 801, which is pressed by the user to activate the activator. The button can sit in a slide frame 802, which connects to the active components via connection 803. The slide frame 802 includes an arm 804 which facilitates the movement and provides stress relief for the slide frame 802.

Figure 9:
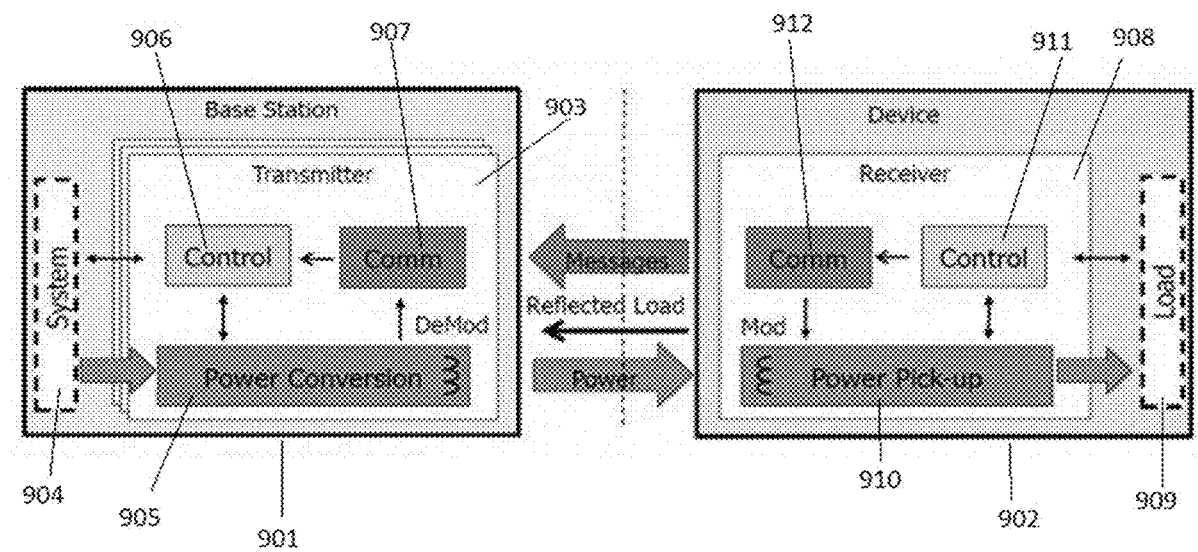
FIG. 9 is a non-limiting embodiment for wireless charging of the band.

The power source can be either a rechargeable or non-rechargeable battery. Rechargeable batteries can be recharged through wired or wireless charging. FIG. 9 illustrates a non-limiting embodiment of Qi charging. A base station 901 can be placed in proximity to, or in contact with, a device 902, such as the band. The base station 901 includes a power transmitter 903. The power transmitter 903 includes a power converter 905, which receives electrical energy from the system 904. The power converter 905 converts the electrical energy into a magnetic field. A control system 906 regulates the amount of power transferred. A communication system 907 communicates with the device 902 to determine the amount of power to transfer. The device 902 includes a receiver 908. A power pick up module 910 receives the power from the base station 901. A control system 911 communicates with the load 909 of the device 902 and a communication system 912. The communication system 912 of the device 902 communicates with the communication system 907 of the base station 901 to control the transfer of power.

One skilled in the art will understand that various combinations and/or modifications and variations can be made in the described systems and methods depending upon the specific needs for operation. Various aspects disclosed herein may be combined in different combinations than the combinations specifically presented in the description and accompanying drawings. Moreover, features illustrated or described as being part of an aspect of the disclosure may be used in the aspect of the disclosure, either alone or in combination, or follow a preferred arrangement of one or more of the described elements. Depending on the example, certain acts or events of any of the processes or methods described herein may be performed in a different sequence, may be added, merged, or left out altogether (e.g., certain described acts or events may not be necessary to carry out the techniques). In addition, while certain aspects of this disclosure are described as performed by a single module or unit for purposes of clarity, the techniques of this disclosure may be performed by a combination of units or modules associated with a device.

I claim:

1. A band, comprising:
an activator and a transmitter;
wherein the band is configured to communicate wirelessly via the transmitter with a separate device having an incoming audio stream selected from any of a microphone, a digital audio source, or an analog audio source;
wherein the band mutes the incoming audio stream on the separate device when the activator is in an inactive state and unmutes the incoming audio stream when the activator is in an active state.

2. The band of claim 1, wherein the band is covered in any one of a membrane, coating, and combinations thereof.

3. The band of claim 1, further comprising an inductive coil as a power source.

4. The band of claim 1, wherein the transmitter is a printed antenna.

5. The band of claim 1, wherein the separate device is a phone.

6. The band of claim 1, wherein the transmitter is a Bluetooth transmitter, an RFID transmitter, or a near field communication transmitter.

7. The band of claim 6, wherein the transmitter is the near field communication transmitter, and wherein the activator, in an active state, interrupts communication from the transmitter.

8. The band of claim 7, wherein the activator is a button having one or more tactile domes.

9. The band of claim 8, wherein the one or more tactile domes have a shape selected from any one of a circle, triangle, oblong, and rectangle.

10. The band of claim 1, wherein the activator is a button positioned on an outer surface of the band.

11. The band of claim 1, wherein the band further comprises an indicator indicating an audio state of the separate device.

12. The band of claim 11, wherein the indicator is positioned on the band.

13. The band of claim 12, wherein the indicator is an LED.

14. The band of claim 1, wherein the transmitter communicates with an application installed on the separate device.

15. The band of claim 1, wherein the transmitter communicates with an operating system of the separate device.

16. The system of claim 1, wherein the activator is a button; and wherein the band further comprises a locking mechanism, the locking mechanism engageable to maintain the activator in either the active or inactive state.

17. A system, comprising:
the band of claim 1, and a phone;
wherein the phone is programmed to communicate with the band; and wherein the phone is programmed to mute an incoming audio stream when the activator on the band is in an inactive state and to unmute the incoming audio stream when the activator on the band is in an active state.

18. The system of claim 17, wherein the phone is programmed to communicate with the band via an external module in contact with the phone.

19. The system of claim 17, wherein the transmitter communicates with an application installed on the phone.

20. The system of claim 17, wherein the transmitter communicates with an operating system of the phone.

21. The band of claim 1, wherein the activator, in an active state, interrupts communication from the transmitter.

22. The system of claim 17, wherein the activator, in an active state, interrupts communication from the transmitter.

* * * * *